(12) United States Patent
Tasevski et al.

(10) Patent No.: US 10,107,841 B2
(45) Date of Patent: Oct. 23, 2018

(54) METHODS AND APPARATUS FOR PEAK-VOLTAGE MEASUREMENT OF AC SIGNALS

(71) Applicant: Texas Instruments Incorporated, Dallas, TX (US)

(72) Inventors: Viktor Tasevski, Richardson, TX (US); Kemal S. Demirci, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 357 days.

(21) Appl. No.: 15/172,403

(22) Filed: Jun. 3, 2016

(65) Prior Publication Data
US 2017/0023621 A1  Jan. 26, 2017

Related U.S. Application Data

(60) Provisional application No. 62/196,826, filed on Jul. 24, 2015.

(51) Int. Cl.
*H02M 1/08* (2006.01)
*G01R 19/04* (2006.01)

(52) U.S. Cl.
CPC .................... *G01R 19/04* (2013.01)

(58) Field of Classification Search
CPC ..... H02M 3/33507; H02M 2001/0029; H02M 1/08; H03K 17/166; H03K 5/24; H03K 19/00361; H03K 19/00384; G01R 31/31924
See application file for complete search history.

(56) References Cited

U.S. PATENT DOCUMENTS

| 5,568,368 | A | * | 10/1996 | Steigerwald | .............. | H02J 3/38 363/132 |
| 8,395,362 | B2 | * | 3/2013 | Brown | ..................... | H02M 1/38 323/224 |
| 2012/0027448 | A1 | * | 2/2012 | Mukaibara | ......... | G03G 15/1645 399/88 |
| 2012/0105034 | A1 | * | 5/2012 | Brown | ................... | H02M 1/38 323/282 |

* cited by examiner

*Primary Examiner* — Alesa Allgood
(74) *Attorney, Agent, or Firm* — Lawrence J. Bassuk; Charles A. Brill; Frank D. Cimino

(57) ABSTRACT

In described examples, an apparatus includes: an input terminal for receiving an alternating current voltage signal; a clamping circuit coupled to the input terminal outputting a clamped voltage signal that is constrained in magnitude; a first comparator coupled to the clamped voltage signal outputting a first compare signal when the clamped voltage signal is a positive voltage that exceeds a positive threshold; and a second comparator coupled to the clamped voltage signal outputting a second compare signal when the clamped voltage signal is a negative voltage that exceeds a negative threshold. The apparatus includes a timer circuit coupled to the first and second compare signal outputting a time duration signal corresponding to a time between the first and second compare signals; and a logic circuit coupled to the time duration output signal determining a peak voltage of the alternative current voltage signal responsive to the time duration output signal.

17 Claims, 7 Drawing Sheets

METHODS AND APPARATUS FOR PEAK-VOLTAGE MEASUREMENT OF AC SIGNALS

RELATED APPLICATIONS

This application claims the benefit of priority under 35 U.S.C. § 119(e) to U.S. Provisional Application Ser. No. 62/196,826 filed Jul. 24, 2015, entitled "INDIRECT PEAK-VOLTAGE MEASUREMENT OF AC SIGNALS," which application is hereby incorporated by reference herein in its entirety.

TECHNICAL FIELD

This application relates in general to systems and integrated circuits where a peak voltage indication of an alternating current (AC) signal is needed, and in particular to providing a peak voltage measurement for relatively high voltage AC signals.

BACKGROUND

Observation or measurement of peak voltage levels is often useful in electronic systems. In certain applications, the peak voltage of the AC signals to be measured can be quite large. For example, in a system that controls or observes residential power, the peak voltage can be 110-130 Volts AC, or 220-240 Volts AC.

The maximum AC voltage that can be safely received at an input pin for most current semiconductor integrated circuits is much lower than the peak voltage of many AC signals. Advanced analog integrated circuits that are currently commercially available from Texas Instruments Incorporated can have a maximum input rating of about 30-40 Volts. Direct coupling of the high voltage AC voltage signals to an input pin is therefore not possible using these modern analog integrated circuits.

In many applications, information about the peak voltage of an AC signal is needed, but it is not always necessary to get precise voltage value measurements. For example, if the application requires a "power good" indication of an AC power signal, a threshold measurement can be sufficient. In one application, if the threshold exceeds 110 Volts, it can be assumed the AC power is sufficiently good for system operations to begin or to continue. Other threshold voltages can be used for different applications.

An example is a so-called "smart" AC outlet which includes an indicator visible to a user. In an example, when the power is approximately 110-120 Volts, a green LED is enabled to visually signal the power is safe for use. When the power is not within a normal range, no green LED signal is enabled, or alternatively a red LED is enabled that can indicate a power problem to the user, indicating that the outlet is not safe to use. An exact numerical value of the AC voltage is not needed for this and many other "power good" applications.

Conventional circuitry arranged to observe an AC signal with a peak voltage above 30 Volts, for example, often requires an AC rectifier along with additional circuitry. In some conventional solutions special high voltage circuit components receive the high voltage AC signal. In alternative conventional solutions, a resistor divider receives the rectified AC signal and provides a divided output voltage that is proportional to the peak voltage (but which falls below a safe input voltage for the measurement circuitry). In addition, an analog to digital (ADC) converter circuit may be needed along with sampling logic to provide an output that indicates the peak voltage level. These ADC circuits are expensive, require precision circuitry and require circuit board area, which is undesirable. Further the resistors in a resistor divider are subject to temperature dependent value variations, and so a resistor divider measurement scheme may require expensive resistors and/or the use of additional temperature compensation circuitry to ensure proper operation of the circuit over a range of expected conditions.

SUMMARY

In an example arrangement, an apparatus includes: an input terminal for receiving an alternating current voltage signal; a clamping circuit coupled to the input terminal, the clamping circuit configured to output a clamped voltage signal that is constrained between a positive voltage magnitude and a negative voltage magnitude; a first comparator coupled to the clamped voltage signal configured to output a first compare signal when the voltage signal is a positive voltage that exceeds a positive threshold reference voltage; and a second comparator coupled to the clamped output signal configured to output a second compare signal when the output voltage signal is a negative voltage that exceeds a negative threshold reference voltage. The apparatus also includes a timer circuit coupled to the first compare signal and to the second compare signal and coupled to a clock signal, configured to output a time duration output signal corresponding to a time interval between the first and second compare signals. In the example arrangement, a logic circuit is coupled to the time duration output signal and configured to determine a peak voltage in the alternating current voltage signal, responsive to the time duration output signal.

DETAILED DESCRIPTION OF THE EMBODIMENTS

Corresponding numerals and symbols in the different figures generally refer to corresponding parts unless otherwise indicated. The figures are not necessarily drawn to scale.

When the term "coupled" is used herein to describe relationships between elements, it is not to be limited to "connected" or "directly connected." "Coupled" may include connections made with intervening elements and additional connections may exist between any elements that are described as "coupled."

Example embodiments recognize solutions for making peak voltage measurements of an AC signal having a peak voltage that can exceed the maximum input voltage for a measurement circuit. In example embodiments, a time interval between portions of an alternating current waveform is determined. A slew rate is then determined from the time interval. The peak voltage is estimated using the slew rate in a linear extrapolation.

In sharp contrast to prior approaches, the example embodiments do not require an expensive analog to digital converter or rectifier components. Use of the embodiments thus enables substantial area reduction, cost reduction and power reduction in AC peak voltage measurement solutions (when compared to conventional circuitry).

Figure 1:
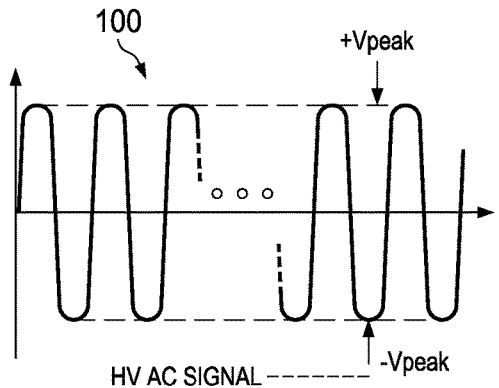
FIG. 1 illustrates a waveform of an AC voltage signal.

FIG. 1 illustrates a timing diagram of a typical AC signal 100 (or high-voltage AC signal (HV AC signal)) with peak voltages such as an AC signal to be observed by the embodiments. The AC signal waveform has a sine, or cosine, wave alternating between peak voltages that have a positive magnitude peak (labeled +Vpeak) and negative magnitude peak (labeled −Vpeak).

Figure 2:
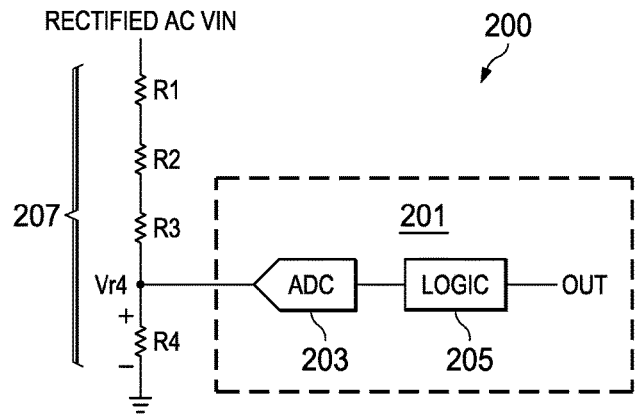
FIG. 2 illustrates in a simplified circuit diagram a conventional AC voltage peak detection circuit.

FIG. 2 illustrates a conventional peak measurement circuit 200 using a resistive divider 207 to observe or measure the voltage of an AC voltage signal. The resistor divider 207 in this example includes four divider resistors R1-R4. In other examples, fewer or more resistors can be used. The voltage across resistor R4, labeled Vr4, is a proportional voltage that corresponds to the AC input voltage labelled "Rectified AC Vin." In FIG. 2, the Rectified AC Vin input voltage has already been rectified, which requires an additional diode rectifier or other rectifier circuit (for clarity this rectifier circuit is not shown). In an alternative arrangement, the AC signal can be rectified within the measurement circuit, and additional rectifier circuitry provided in the measurement circuit.

The proportional voltage Vr4 is designed to fall within the safe input voltage ratings for the analog to digital converter ADC 203. The ADC 203 outputs a digital signal corresponding the analog voltage Vr4, and logic 205 can compare that digital voltage signal to a threshold, or otherwise indicate a range or value on digital signal OUT.

The ADC circuit 203 is a relatively expensive circuit and also requires area and power on a silicon integrated circuit or on a circuit board. Further, the resistors R1-R4 are subject to temperature variation that will affect the accuracy of the output. In order to use the resistor divider, temperature compensation circuitry, or additional expense in using high accuracy temperature insensitive resistors may be needed.

Figure 3:
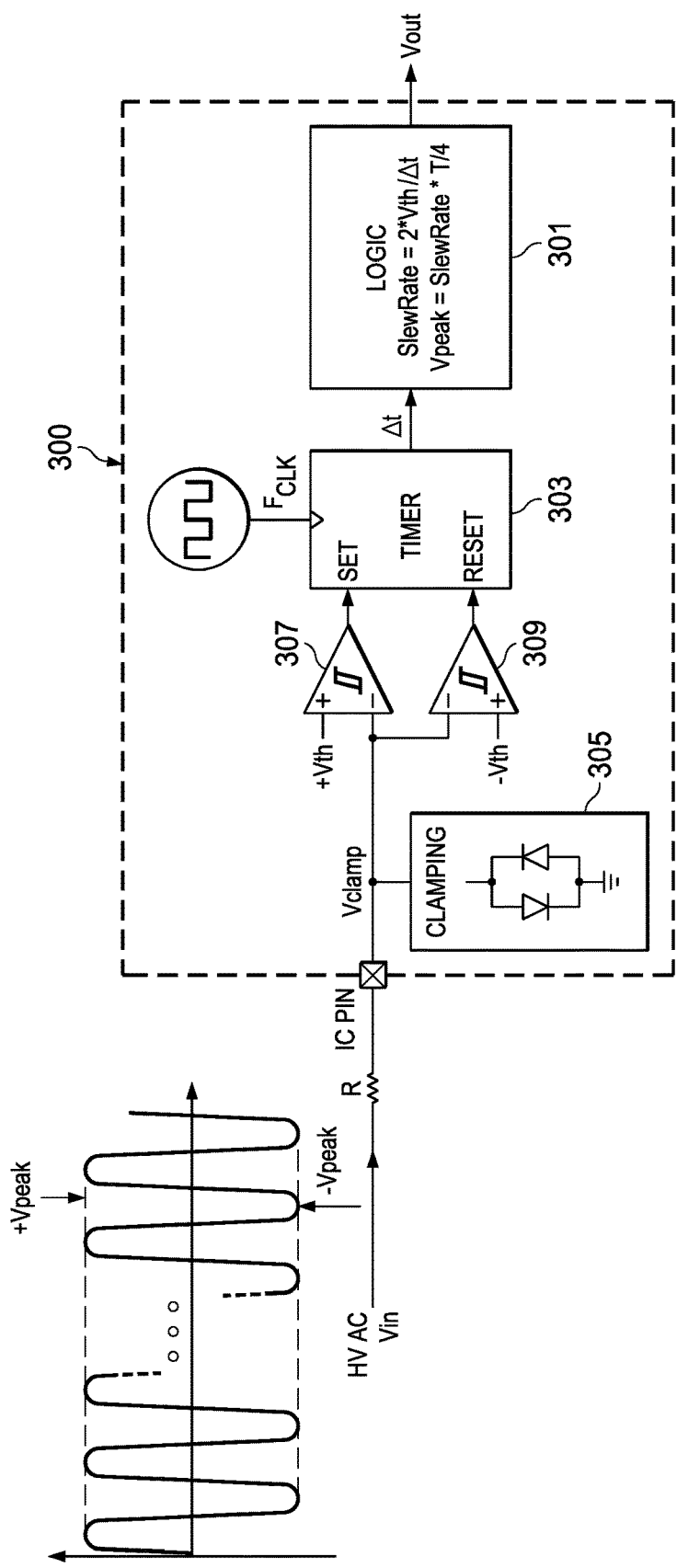
FIG. 3 is a simplified circuit diagram of a peak voltage detection embodiment.

FIG. 3 illustrates an example circuit 300. Circuit 300 is arranged for observing high peak voltage AC signals. The term "high peak voltage" can include residential power AC signals, such as 110-120 Volts AC, or 220-240 Volts AC, as non-limiting examples. The term "high peak voltage" can also include much lower AC voltages such as 30 Volts, 25 Volts, or lower voltages to be measured or observed. In examples, these peak voltages are higher than the maximum safe input voltage for a circuit component used in the embodiments. In FIG. 3, circuit 300 is shown as a portion of an integrated circuit. However, in further alternatives, the components within circuit 300 can be formed as discrete components on a circuit board or substrate. Multiple chip modules (MCMs) can implement the circuitry shown in 300. The timer circuitry 303 and logic circuitry 301 can be provided as part of individual integrated circuits. In other examples, these functions can be combined to form a single integrated circuit with the comparators 307, 309 and clamping circuit 305 formed externally. In the illustrative example of FIG. 3, the circuitry 300 can be included on a single dedicated integrated circuit, or circuit 300 can be provided as part of an integrated circuit along with additional desired functions.

In FIG. 3, the high voltage input signal labelled "HV AC Vin" is coupled to a series coupled impedance, resistor R. Resistor R can be selected to have a relatively high value, such as 100 kOhms. When resistor R is chosen at a high impedance value, the peak detection circuitry has a high input impedance, which is desirable. When the peak detection circuitry has a high input impedance, the current load on the input signal HV AC Vin is reduced. In this example, the resistor R is series coupled between the AC input signal and the circuit 300 so that the AC measurement circuitry 300 is a high impedance load. In certain applications, the signal Vin may have a relatively weak drive, that is, it can be sourced by a low current driver. Loading of the signal HV AC Vin by a measurement circuit would affect the signal voltage and frequency, and this is undesirable. By choosing the value of the resistor R correctly, this loading effect can be avoided. In other applications where current and loading of the AC signal are not concerns, resistor R can be selected at a lower value. The value for resistor R is therefore application dependent.

In FIG. 3, the input pin labeled "IC PIN" of circuit 300 is coupled to the output of resistor R and receives an AC voltage corresponding to the input signal HV AC Vin. In the embodiments, no rectifier is needed. The input pin IC pin is coupled to a clamping circuit 305. In the example of FIG. 3, the clamping circuit 305 is implemented with a pair of diode clamp devices. In certain integrated circuit technologies, input pins can include an ESD clamping circuit that can provide the function of circuit 305. In alternative embodiments, circuit 305 can be provided explicitly, as is shown in FIG. 3. In addition, other clamping circuit types can form additional embodiments of circuit 300. The function of the clamping circuit 305 is to constrain the positive and negative magnitudes of the output voltage Vclamp to a range within the maximum safe input voltage range for an integrated circuit including circuit 300 (and for comparators 307, 309). In some embodiments, the clamp 305 may restrict the positive and negative magnitudes of voltage Vclamp even more, to provide an additional margin for safety.

In operation, the voltage Vclamp will follow the rise of the AC signal HV AC Vin at the IC pin up to the clamped positive voltage, and then remain at that level until HV AC Vin falls through the positive clamped voltage level. The voltage Vclamp will follow the signal HV AC Vin through zero volts and will fall negatively until signal HV AC Vin reaches the negative clamped voltage. At this point the voltage Vclamp will remain flat at the negative clamped voltage until the signal HV AC Vin again rises through the clamped negative voltage.

The voltage Vclamp is input into a pair of comparators 307, 309. In an example embodiment these comparators include hysteresis, as shown in FIG. 3. In other examples the hysteresis is not included. Hysteresis in a comparator can reduce noise sensitivity by ensuring the comparators do not change outputs rapidly in the presence of noise.

Comparator 307 compares the voltage Vclamp to a positive threshold voltage +Vth. This reference voltage can be generated from a bandgap generator, for example. Other reference voltages can be used. Comparator 309 compares the voltage Vclamp to a negative threshold voltage −Vth.

This negative reference voltage can be the complement of the positive reference voltage +Vth. Other negative reference voltages as well as 0V (zero volts/ground potential) can also be used. In some examples, circuit 300 may include one or more reference voltage generators to generate the positive and negative reference voltages.

In an alternative arrangement, the reference voltages +Vth, −Vth might not be used. In this case, the comparators can detect when the voltage VCLAMP is clamped to the maximum positive voltage +Vclamp, and can detect when the voltage VCLAMP is clamped to the maximum negative voltage −Vclamp.

In this example arrangement, the outputs of the comparators 307, 309 are input to the set and reset input pins of a timer circuit 303. Timer circuit 303 is clocked by a signal $F_{CLK}$. This clock signal can have a frequency that is several times the frequency of the AC signal, thereby providing an oversampling function which enables accurate reproduction of the transitions of the AC signal HV AC Vin through the threshold voltage levels. In one example $F_{CLK}$ was selected to be 16 MHz for an AC signal in the 60 kHz range.

The timer 303 outputs a time duration value that corresponds to a time delta, this output signal is labeled Δt in FIG. 3. This output signal corresponds to a time difference measured between the time the AC signal transitions through the positive threshold level +Vth and the time it transitions through the negative threshold level −Vth, or vice versa. This time duration Δt corresponds to the slope, or slew rate, of the AC signal. Using the slew rate, the peak AC voltage can be determined even though the peak AC voltage exceeds the maximum input voltage the circuit 300 can receive.

Logic circuit 301 can be implemented as a dedicated hardware function or as a programmable function that performs a slew rate computation. Logic circuit 301 also determines a peak voltage Vpeak in the signal HV AC Vin. In additional alternative embodiments, a programmable function such as a floating point unit (FPU), an arithmetic logic unit (ALU), a processor, microprocessor, DSP, analog signal processor, or other computation block can implement logic block 301. An output signal Vout that corresponds to the peak voltage Vpeak is then output by logic circuit 301 for additional use by the circuitry 300. For example a display visible to a user can display the peak voltage Vout. For "power good" applications the output Vout can be used by a processor or comparator to drive an LED or other visible indicator. For systems where the AC power is monitored, the output Vout can be used to determine whether a system can be enabled to operate safely, for example when used in an AC motor controller circuit. In some examples, Vout can communicate the peak voltage in the AC input signal Vin. In an alternative example, Vout can be a signal indicating a threshold peak AC voltage has been reached, without including any particular value information. In that case, Vout can be a "flag" indicating the peak voltage of the AC input signal Vin exceeds a defined threshold peak voltage. The threshold peak voltage can be a predetermined voltage such as 110 Volts, 120 Volts, 220 Volts, 60 Volts, or other defined peak threshold voltage.

Figure 4:
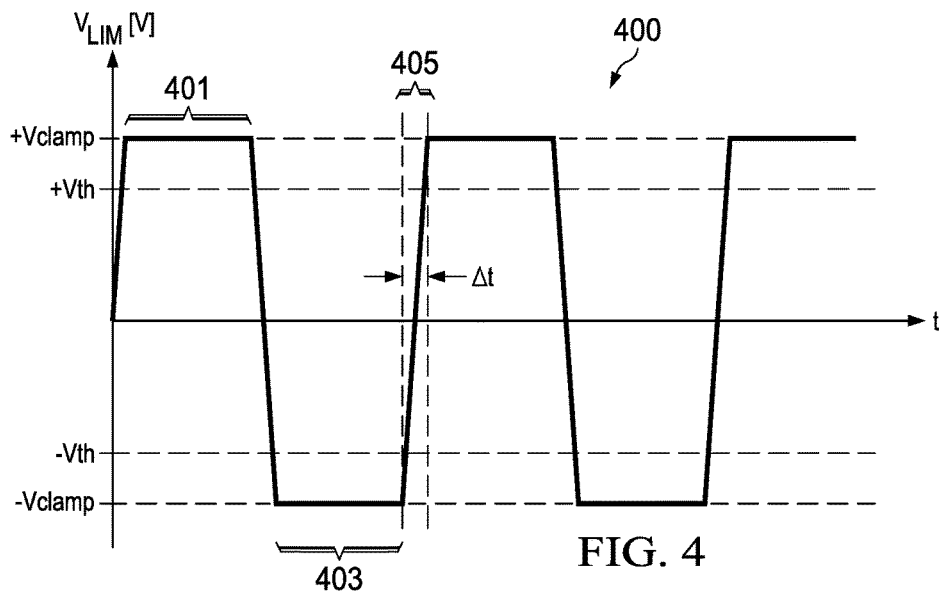
FIG. 4 is a timing diagram illustrating operation of an embodiment.

FIG. 4 illustrates in a timing diagram 400 the time duration period Δt and example operations of the clamped voltage signal Vclamp for the example embodiment of FIG. 3. Voltage levels are indicated on the vertical or Y axis, and time is indicated on the horizontal or X axis. In FIG. 4, the voltage thresholds +Vth, −Vth are positioned symmetrically about zero volts and are less than the maximum peak positive and negative clamping voltages +Vclamp, −Vclamp. The signal Vclamp appears as a clamped AC signal, with constrained voltage magnitudes when the input voltage signal HV AC Vin in FIG. 3 is a positive voltage greater than +Vclamp, or when the input AC voltage signal is a negative voltage less than −Vclamp. For example, region 401 is an example where the AC input signal voltage exceeds +Vclamp, and region 403 illustrates an example where the AC input signal falls below −Vclamp.

Region 405 illustrates the time duration Δt for this example. As the voltage Vclamp rises through the negative threshold voltage −Vth, the timer circuit 303 in FIG. 3 is reset. The timer will count (being clocked by the clock signal $F_{CLK}$) until the voltage Vclamp exceeds voltage +Vth, when the timer circuit 303 is set. The timer circuit 303 may cease counting in response to being set, and output the time duration Δt. The time duration Δt corresponds to the number of $F_{CLK}$ cycles counted between the reset and set signals (or vice versa, for a falling input signal portion) scaled by the clock frequency. In an embodiment where the local clock has a frequency $F_{CLK}$, the quantity Δt is the counter value divided by the frequency of clock signal $F_{CLK}$. In some examples, timer circuit 303 may output the counter value directly to logic circuit 301 rather than the time duration Δt. In such examples, logic circuit 301 may determine the appropriate time duration Δt based on the counter value and the frequency of FCLK.

The slew rate (in volts/micro-second) of the clamped voltage signal Vclamp can be determined by a slope computation shown in Equation 1:

$$\text{SlewRate}=2*Vth/\Delta t[V/\mu s], \text{ where } \Delta t=\text{Timer\_count}/\text{FCLK}. \qquad (1)$$

In FIG. 3, the slew rate can be computed by the logic circuit 301.

The peak voltage of the AC input signal can then be determined using the slew rate and the frequency (or period) of the input signal. A zero crossing frequency detector (not shown) can be used to find the frequency of the input signal. The computation is made assuming the peak voltage in the input voltage Vin occurs in the center of each wave portion, that is, at T/4, where T is the period of the signal. The peak voltage computation may then perform a multiply and divide operation as shown in Equation 2:

$$V\text{peak}=\text{SlewRate}*T/4. \qquad (2)$$

To perform Equation 2, the frequency (or period T) of the signal Vin is needed. This frequency can be determined using a zero crossing detector, for example, to compute the frequency, and then the period T of the input signal Vin is the inverse 1/F.

In FIG. 3, the quantity Vpeak is determined by logic circuit 301.

Figure 5:
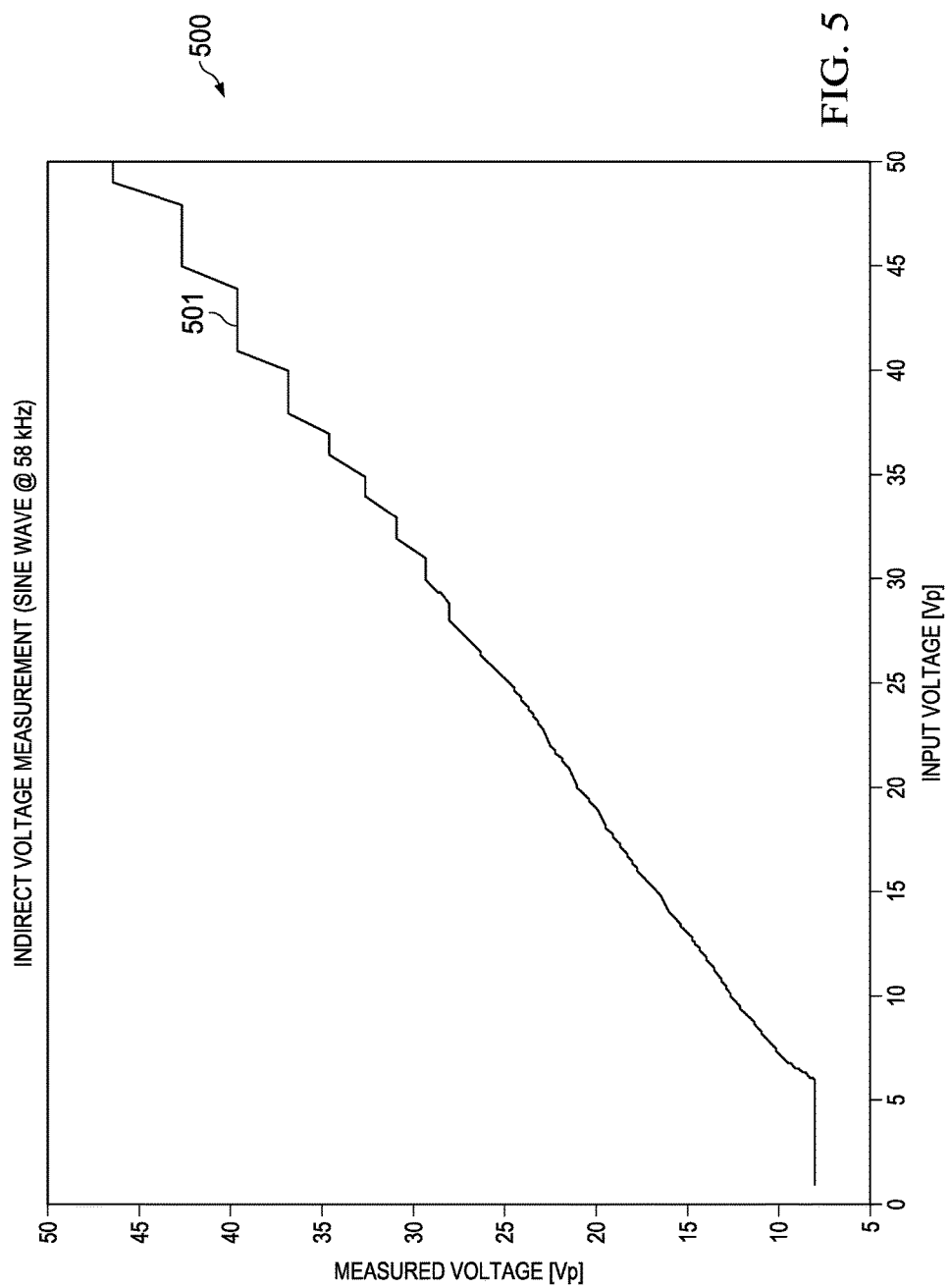
FIG. 5 is a voltage graph illustrating operation of an embodiment.

FIG. 5 depicts a graph 500 illustrating the results obtained for an observed peak voltage using an embodiment. In FIG. 5, the input voltage peak [Vp] is plotted along the horizontal axis, and the measured peak voltage [Vp] is plotted along the Y axis. In the example of FIG. 5, the input AC signal has a sine waveform at a frequency of 58 kHz. The timer clock frequency for the example in FIG. 5 was 16 MHz.

In an ideal case, the data line 501 would be a straight line indicating the measured peak voltage equals the input peak voltage at each point along the data line 501. However, as can be seen in FIG. 5, for input voltages with a peak voltage Vp greater than 30 Volts, some quantization errors occur, and these increase as the peak voltage increases. The data line 501 makes a "stair step" pattern due to these quantization errors. For some applications, where only a "power good" indication is needed, the accuracy obtained in the example shown in FIG. 5 may be sufficient. For other applications, the quantization errors may need to be improved.

Figure 6:
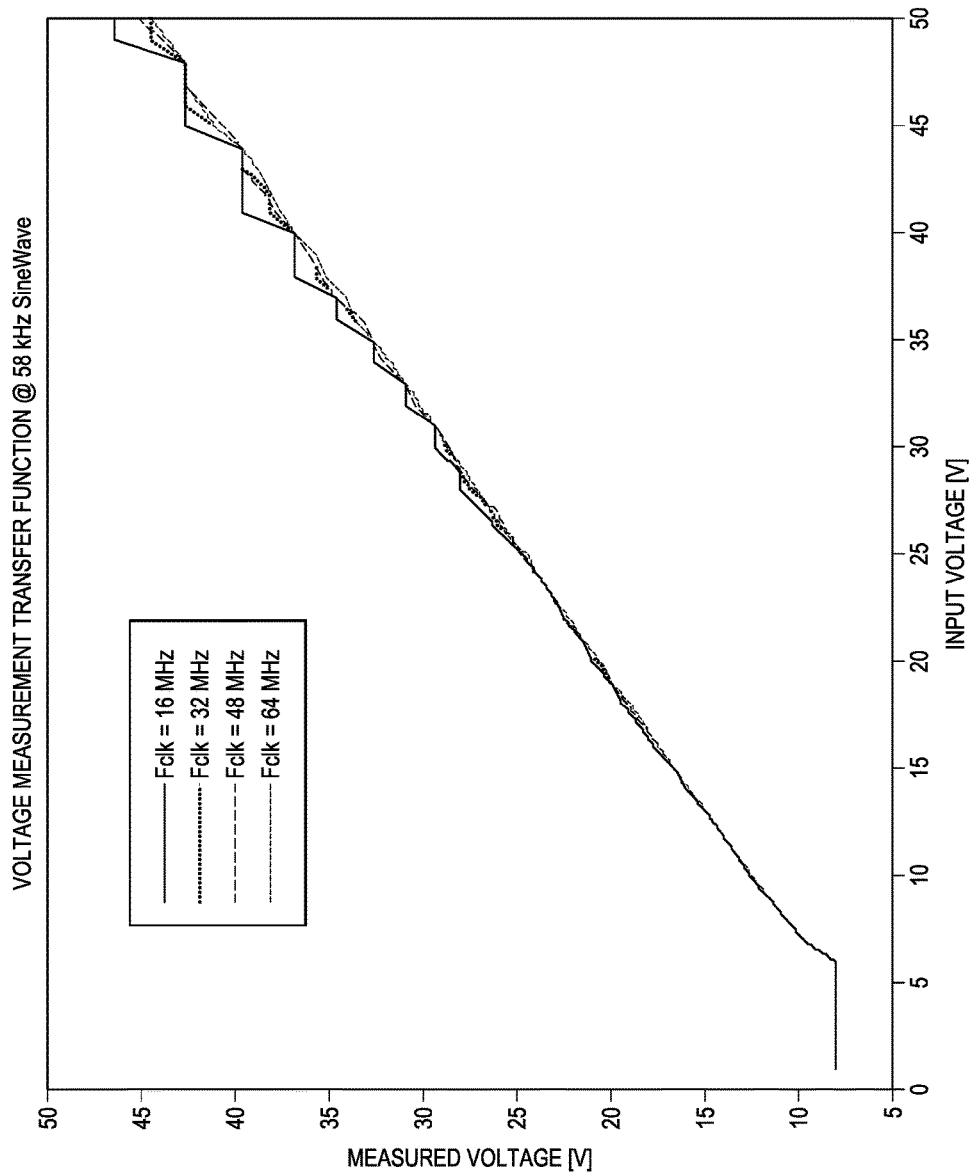
FIG. 6 is a voltage graph comparing results obtained for several embodiments.

FIG. 6 illustrates in another graph 600 the data lines obtained for the same input voltage signal (a sine waveform at 58 kHz) over a range of input peak voltages from 0-50 Volts, where different clocking frequencies Fclk are used for the timer circuit (such as 303 in FIG. 3.) The data line shown in FIG. 5, is again shown as the solid data line obtained using a timer clock signal having a clock frequency of 16 MHz. The graphs plotted in FIG. 6 illustrate that as the timer clock signal frequency Fclk increases, the resulting data line increases in accuracy. As can be seen by examining the line for Fclk=64 MHz, the line drawn with small dashes, the quantization data errors are almost eliminated, and the data lines for Fclk=48 MHz (the line drawn with larger dashes) indicates improvement over the initial data line for Fclk=16 MHz, but the data line for Fclk=48 MHz is not as accurate as the data line for Fclk=64 MHz. In designing the circuitry for a particular application, a design choice can be made. For increased accuracy, the clocking signal frequency Fclk can be increased. The number of bits needed for the timer circuit will be larger as frequency increases (the count obtained will be higher as the clock frequency increases, requiring more bits to represent the counter value) so a design tradeoff exists between the peak voltage accuracy required and the size of the timer circuitry and frequency of the timer clock Fclk. If less accuracy is sufficient, the circuitry can be reduced in size and used with reduced Fclk frequency. If more accuracy is needed, the accuracy can be increased with a larger timer circuit and increased clock frequency. Circuit simulations can confirm that the operation of the peak measurement circuitry meets design requirements.

Figure 7:
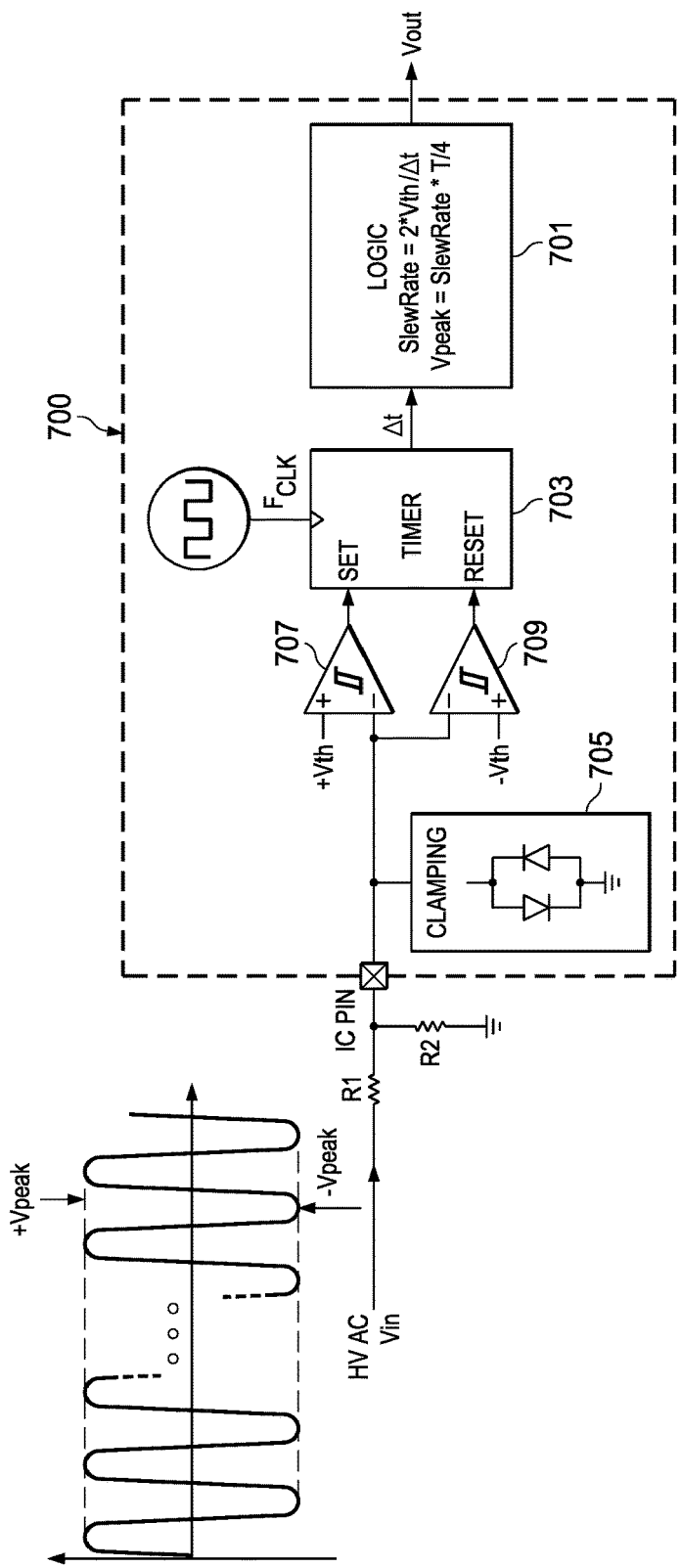
FIG. 7 is a simplified circuit diagram of another embodiment.

FIG. 7 illustrates another example embodiment. In FIG. 7, circuit 700 includes elements corresponding to circuit 300 in FIG. 3. These elements have similar reference labels but now starting with the first digit "7," for convenience. The circuit of FIG. 7 includes clamping circuit 705, comparators 707 and 709, threshold voltages +Vth, −Vth, timer circuit 703, and logic 701. The input signal HV AC Vin is again shown in the same manner as in FIG. 3. The series resistor R from the embodiment of FIG. 3 is now replaced by a first resistor R1.

In FIG. 7, a second resistor R2 is coupled between the input to the circuit 700, labeled IC PIN, and a ground terminal. This second resistor R2 can have impedance values that are compatible with being fabricated within an integrated circuit. In the example of FIG. 7, the resistor R2 is provided external to the circuit 700. In an alternative arrangement the circuit 700 can be entirely provided on a single integrated circuit. Alternatively, circuit 700 can be provided on multiple integrated circuits, within a larger highly integrated system IC, or as discrete components on a substrate.

By providing the second resistor R2, the slew rate of the clamped voltage Vclamp can be attenuated to increase the accuracy of the measurement made by the circuitry. That is, by reducing the slope of the waveform Vclamp, the time duration between the crossing of the two threshold voltages increases, and the accuracy of the measurement also increases.

The peak voltage is now determined by a modified equation, as shown in Equation 3:

$$V\text{peak}=(1+R1/R2)*\text{SlewRate}*T/4. \quad (3)$$

To complete the calculation in Equation 3, the period T (or frequency F) of the input AC signal is needed. This can be determined simply by providing a zero crossing detector to determine the frequency, or by another counting means. For simplicity this circuitry is not shown in FIG. 7.

Figure 8:
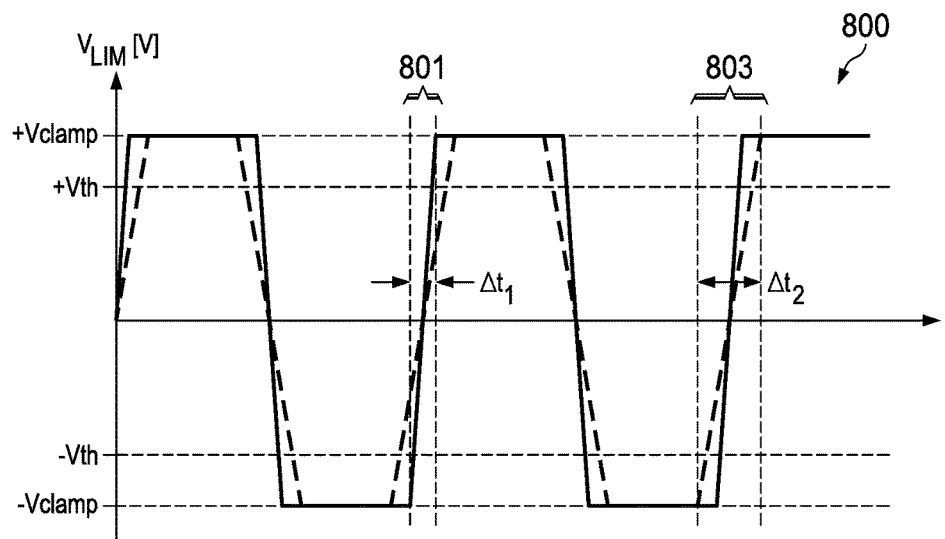
FIG. 8 is a timing diagram comparing operation of two embodiments.

FIG. 8 depicts, in a timing diagram 800, a comparison of a voltage Vclamp obtained at the clamping circuit in an example such as shown in FIG. 3 with a single input resistor R, and the corresponding time duration $\Delta t_1$, compared with the corresponding voltage signal obtained in an example such as shown in FIG. 7 with the two resistors R1 and R2, and a corresponding time duration $\Delta t_2$. Voltage levels are indicated on the vertical or Y axis, and time is indicated on the horizontal or X axis. In FIG. 8 the voltage thresholds +Vth, −Vth are positioned symmetrically about zero volts on the vertical axis and are less than the maximum peak positive and negative clamping voltages +Vclamp, −Vclamp. The two clamped AC voltage signals have constrained voltage magnitudes when the AC input voltage signal is a positive voltage greater than the voltage +Vclamp, or when the input AC voltage signal is a negative voltage less than the voltage −Vclamp.

In FIG. 8, region 801 indicates a measurement of $\Delta t_1$ for an example circuit using the single series resistor R, such as circuit 300 shown in FIG. 3. Region 803 indicates a measurement of time duration $\Delta t_2$ for an example circuit using the two resistors R1 and R2, such as circuit 700 in FIG. 7. As can be seen in FIG. 8, the time duration $\Delta t_2$ is longer than the time duration $\Delta t_1$. Because the amount of time the clamped voltage signal takes between crossing a first voltage threshold such as −Vth and then crossing the opposing threshold such as +Vth is also the observation time for the timer circuit, the longer duration time $\Delta t_2$ allows for more samples by the timer circuit, and thus increases the accuracy of the measurement. Therefore a design tradeoff exists because although the accuracy increases in the example embodiment of FIG. 7, an additional component (resistor R2) is needed for the alternative arrangement. Depending on the requirements of a particular design, the appropriate peak voltage detection circuit can be chosen.

Figure 9:
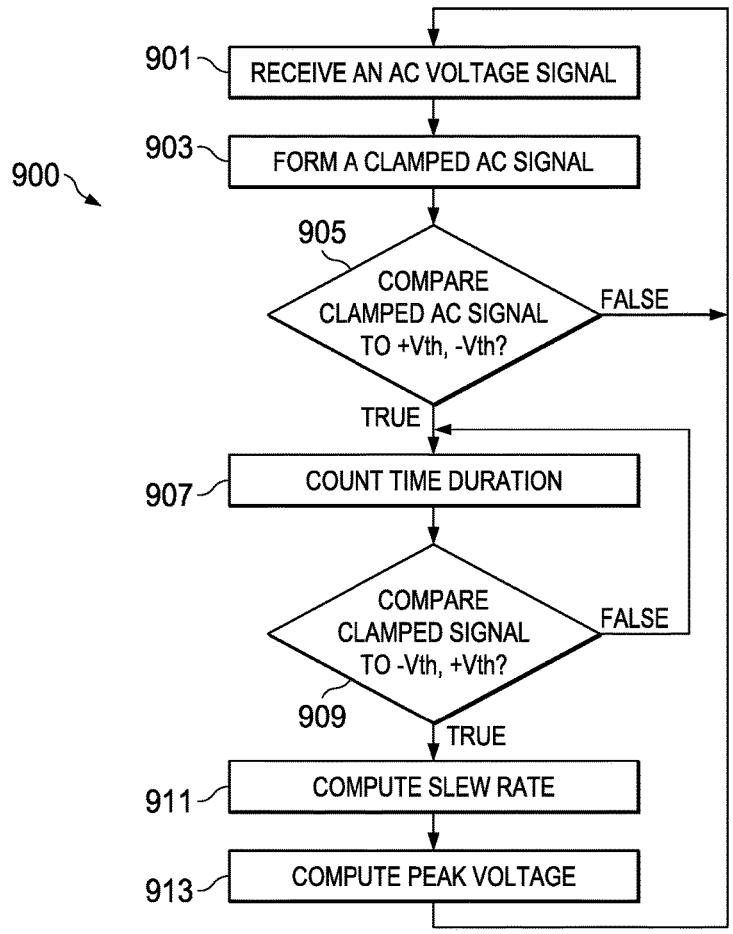
FIG. 9 is a flow diagram illustrating a method embodiment.

FIG. 9 is a flow diagram illustrating a method embodiment 900. In FIG. 9, the method begins at step 901. At step 901 the method receives an AC voltage signal. The peak voltage of this AC signal can be higher than a safe input voltage for a circuit. At step 903, a clamped AC voltage signal is formed. At step 905, the clamped AC voltage signal is compared to a positive threshold and a negative threshold. The comparison is true if the clamped AC voltage signal is greater than the positive threshold and if the clamped AC voltage signal is less than the negative threshold. If neither comparison is true, the method returns to step 901 and continues. If a threshold comparison is true, the method transitions to step 907. At step 907 a count that corresponds to a time duration is incremented. At step 909, a compare to the voltage thresholds is made, this time in the opposite direction of the comparison that was true in step 905. If the clamped AC signal that was less than the negative threshold at step 905 is now greater than the positive threshold, the comparison at 909 is true. If the clamped AC signal that was greater than the positive threshold at step 905 is now less than the negative threshold, the comparison at 909 is true. If the comparison in 909 is false, then the method transitions back to step 907 and the count is incremented. If the comparison in 909 is true, then the clamped voltage has transitioned from one threshold voltage to the other threshold voltage, and the slope has been measured using the counter. In the case when the comparison at step 909 is true, the method transitions to step 911. At step 911 the time duration is used to compute the slew rate. This can be done using Equation 1 as described hereinabove, alternatively in the two resistor arrangement, Equation 3 can be performed. The method then transitions to step 913 and the peak voltage is determined using Equation 2.

Figure 10:
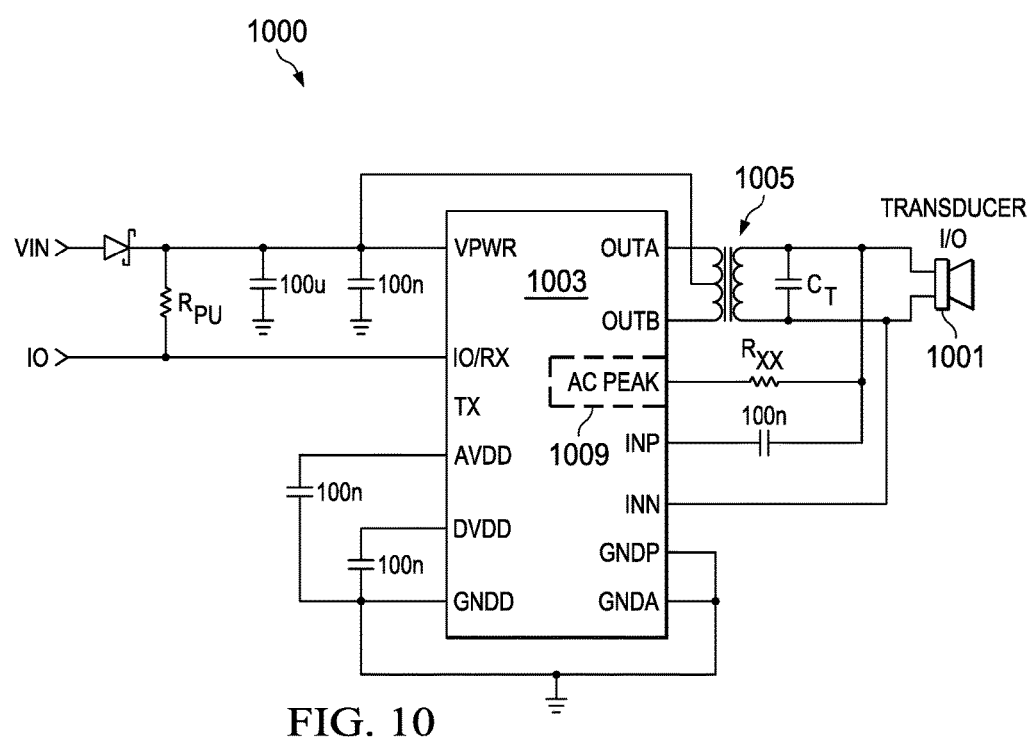
FIG. 10 is a simplified block diagram of a system using an embodiment.

FIG. 10 depicts in a block diagram a system 1000 using an embodiment. In FIG. 10, a transducer 1001 is shown. In one example application the transducer acts as both an output and an input for ultrasonic waves. The transducer enables position sensing using echolocation. An ultrasonic wave is output by the transducer 1001 and the time for return of the corresponding echo signal measures the proximity of the transducer to other objects. This example system is useful for proximity detectors in automotive applications or in other proximity detectors.

In system 1000, the transducer 1001 can be driven as an output device. To drive transducer 1001, a controller integrated circuit 1003 uses pulses on the outputs OUTA and OUTB to step up a voltage from a terminal VIN to form an AC signal using transformer 1005. This voltage is an AC voltage that can exceed the safe input voltage for the integrated circuit 1003. In the application, it is important that the integrated circuit 1003 know whether the transformer 1005 is operating properly in a transmit operation. An AC peak detection circuit 1009, which can be implemented using the embodiment of FIG. 3, for example, is included in the controller integrated circuit 1003. During transmit operations, the AC voltage at the input to the transducer 1001 is coupled through a series impedance, resistor Rxx, to circuitry 1009 for peak detection. The AC peak detection circuitry can be the embodiment as shown in FIG. 3, 300, to determine if the AC voltage has a peak that is above a threshold, indicating good power has been output to the transducer 1001. The resistor Rxx provides a high impedance to the input from the transducer, so that the input is not loaded by the AC peak circuit 1009. This may be useful because in receiving operations, the transducer 1001 drives the input with a weak drive circuit. The input from the transducer is then received by the controller 1003 at the input signal pins INP and INN. If the AC peak detection circuit 1009 represented a high current load, the weak input signal from transducer 1001 in receive operations would be detrimentally affected by changing the frequency and voltage of the input signal. By providing a relatively high impedance in the series resistor Rxx to the AC peak circuit 1009, this detrimental effect is prevented or eliminated.

Although illustrative examples described hereinabove are for a transducer application and for a "power good" application, the peak voltage detection embodiments are useful for any application where an AC voltage signal is to be monitored using a circuit having a safe input voltage that is less than an expected peak voltage in the AC voltage signal. AC peak voltage detection is useful in a wide variety of applications, and the embodiments can be applied to any of these.

The logic circuitry and timer circuitry of the embodiments can be provided in any number of implementation approaches, including: using dedicated circuitry formed in a custom integrated circuit; using an application specific integrated circuit (ASIC); using a user programmable logic device including an FPGA or CPLD device; using a programmable processor such as a DSP, analog processor, CPU, microcontroller unit (MCU), or microprocessor; using discrete components including logic gates; and using software with off the shelf systems modified to perform the method embodiments.

Accordingly, in described examples, an apparatus includes: an input terminal for receiving an alternating current voltage signal; a clamping circuit coupled to the input terminal; the clamping circuit configured to output a clamped voltage signal that is constrained between a positive voltage magnitude and a negative voltage magnitude; a first comparator coupled to the clamped voltage signal and coupled to a positive threshold reference voltage outputting a first compare signal when the voltage signal is a positive voltage that exceeds the positive threshold reference voltage; and a second comparator coupled to the clamped output signal and coupled to a negative threshold reference voltage, configured to output a second compare signal when the output voltage signal is a negative voltage that exceeds the negative threshold reference voltage. The apparatus further includes a timer circuit coupled to the first compare signal and coupled to the second compare signal and coupled to a clock signal that outputs a time duration output signal corresponding to a time interval between the first and second compare signals. A logic circuit coupled to the duration output signal determines a peak voltage in the alternating current voltage signal responsive to the time duration output signal.

In a further example, the logic circuit is configured to perform the calculation: Slew Rate=2*Vth/delta t; where Vth equals the positive threshold voltage, and delta t is equal to a ratio of the time duration output signal divided by the frequency of the clocked signal. In still another example, the logic circuit is further configured to perform the calculation: Vpeak=Slew Rate*T/4; where T is the frequency of the alternating current voltage signal.

In yet another example, the clamping circuit further includes one or more diodes. In still another example, the clamping circuit further includes a first diode that is forward biased with respect to a positive voltage and a second diode arranged in parallel to the first diode that is forward biased with respect to a negative voltage, relative to a ground terminal.

In another example, the apparatus further includes an impedance series coupled between the input terminal and the clamping circuit. In still a further example, the series impedance further includes a resistor. In a least some examples, the apparatus further includes a second impedance coupled between the output of the first impedance and a ground terminal.

In at least one example, the first and second comparators each further include a hysteretic comparator. In some examples, the alternating current voltage signal has a peak voltage that exceeds a maximum input voltage. In an example, the alternating current voltage signal has a peak voltage greater than 40 Volts.

In a further example, the logic circuit is further configured to perform the calculation: Vpeak=(1+value of the first impedance/value of the second impedance)*Slew Rate*T/4; where T is the period of the alternating current voltage signal.

An example method includes: receiving an alternating current voltage signal; forming a clamped voltage signal from the alternating current voltage signal, wherein the clamped voltage signal is constrained to a predetermined maximum positive voltage and a predetermined negative voltage that are less than a peak voltage of the alternating current voltage signal; comparing the clamped voltage signal and to a positive reference threshold voltage, and outputting a set signal when the clamped voltage signal exceeds the positive reference threshold voltage; comparing the clamped voltage signal to a negative threshold voltage, and outputting a reset signal when the clamped voltage signal exceeds the negative reference threshold voltage. The method also includes forming a timer duration signal indicating a time between the set and reset signals; and using the timer duration signal, determining a peak voltage in the alternating current voltage signal.

In another example, a method includes performing the calculation of: Slew Rate of the alternating current voltage signal=2*Vth/delta t; where Vth equals the positive threshold voltage, and delta t is equal to a ratio of the output of the timer circuit divided by the frequency of the clocked signal.

In still a further example, a method includes performing the calculation of: Vpeak=Slew Rate*T/4; where T is the frequency of the alternating current voltage signal. In yet another example, a method includes outputting a signal indicating when the calculated peak voltage is greater than a predetermined threshold.

In another example, an integrated circuit for monitoring an alternating current voltage signal includes: an input terminal coupled to receive the alternating current voltage signal; a clamping circuit coupled to the input terminal and having an output voltage, the clamping circuit configured to limit the output voltage signal between a predetermined positive voltage magnitude and a predetermined negative voltage magnitude; a first comparator coupled to the output voltage signal of the clamping circuit and coupled to a positive threshold reference voltage, configured to output a set signal responsive to a positive magnitude of the output voltage signal that exceeds the positive threshold reference voltage; and a second comparator coupled to the output voltage signal of the clamping circuit and coupled to a negative threshold reference voltage, configured to output a reset signal responsive to a negative magnitude of the output voltage signal that exceeds the negative threshold reference voltage. The integrated circuit also includes a timer circuit coupled to the set signal and coupled to the reset signal and sampling the set signal and the reset signal responsive to a clock signal, configured to output a time duration signal corresponding to the time between set and reset signals; and a logic circuit coupled to the timer circuit configured to determine a peak voltage in the alternating current voltage signal responsive to the time duration signal.

In still another example, an integrated circuit includes the logic circuit to perform the calculations of: Slew Rate of the alternating current voltage signal=2*Vth/delta t; where Vth is the positive threshold voltage, and delta t is equal to a ratio of the output of the timer circuit divided by the frequency of the clocked signal, and Vpeak=Slew Rate*T/4; where T is the frequency of the alternating current voltage signal.

Modifications are possible in the described embodiments, and other embodiments are possible within the scope of the claims. Various modifications can be made in the order of steps and in the number of steps to form additional novel arrangements that incorporate aspects of the present application, and these modifications will form additional alternative arrangements that are contemplated and which fall within the scope of the appended claims. Accordingly, the appended claims are intended to include within their scope such processes, machines, manufacture, compositions of matter, means, methods, or steps.

What is claimed is:

1. An apparatus, comprising: an input terminal for receiving an alternating current voltage signal; a clamping circuit coupled to the input terminal, the clamping circuit configured to output a clamped voltage signal that is constrained between a positive voltage magnitude and a negative voltage magnitude; a first comparator coupled to the clamped voltage signal, and configured to output a first compare signal when the clamped voltage signal is a positive voltage that exceeds a positive threshold reference voltage; a second comparator coupled to the clamped voltage signal and configured to output a second compare signal when the clamped voltage signal is a negative voltage that exceeds a negative threshold reference voltage; a timer circuit coupled to the first compare signal and coupled to the second compare signal and coupled to a clock signal, and configured to output a time duration output signal corresponding to a time interval between the first and second compare signals; and a logic circuit coupled to the time duration output signal and configured to determine a slew rate of the alternative current voltage signal responsive to the time duration output; wherein the logic circuit is configured to perform the calculation: Slew Rate=2*Vth/delta t; where Vth equals the positive threshold voltage, and delta t is equal to a ratio of the time duration output signal divided by the frequency of the clocked signal.

2. The apparatus of claim 1, wherein the logic circuit is further configured to perform the calculation: Vpeak=Slew Rate*T/4; where T is the period of the alternating current voltage signal.

3. The apparatus of claim 1, wherein the clamping circuit further includes one or more diodes.

4. The apparatus of claim 1, wherein the clamping circuit further includes a first diode that is forward biased with respect to a positive voltage and a second diode arranged in parallel to the first diode that is forward biased with respect to a negative voltage, relative to a ground terminal.

5. The apparatus of claim 1, wherein the first and second comparators each further include a hysteretic comparator.

6. The apparatus of claim 1, wherein the logic circuit is arranged to output a signal indicating the voltage Vpeak exceeds a predetermined threshold.

7. The apparatus of claim 1, wherein the predetermined threshold is greater than 100 Volts.

8. The apparatus of claim 1, further comprising an impedance series coupled between the input terminal and the clamping circuit.

9. The apparatus of claim 8, wherein the impedance further includes a resistor.

10. The apparatus of claim 8, and further comprising a second impedance coupled between the output of the first impedance and a ground terminal.

11. The apparatus of claim 10, wherein the logic circuit is further configured to perform the calculation:

$V\text{peak}=(1+\text{value of the first impedance/value of the second impedance})*\text{Slew Rate}*T/4$; where $T$ is the period of the alternating current voltage signal.

12. The apparatus of claim 1, wherein the alternating current voltage signal has a peak voltage that exceeds a maximum input voltage.

13. The apparatus of claim 12, wherein the alternating current voltage signal has a peak voltage greater than 40 Volts.

14. A method, comprising: receiving an alternating current voltage signal; forming a clamped voltage signal from the alternating current voltage signal, wherein the clamped voltage signal is constrained to a predetermined maximum positive voltage and a predetermined negative voltage that are less than a peak voltage of the alternating current voltage signal; comparing the clamped voltage signal to a positive reference threshold voltage, and outputting a set signal when the clamped voltage signal exceeds the positive reference threshold voltage; comparing the clamped voltage signal to a negative threshold voltage, and outputting a reset signal when the clamped voltage signal exceeds the negative reference threshold voltage; forming a timer duration signal indicating a time between the set and reset signals; and using the timer duration signal, determining a slew rate in the alternating current voltage signal; wherein determining a slew rate in the alternating current voltage signal includes performing the calculation of: Slew Rate of the alternating current voltage signal=2*Vth/delta t; where Vth equals the positive threshold voltage, and delta t is equal to a ratio of the output of the timer circuit divided by the frequency of the clocked signal.

15. The method of claim 14, wherein determining a peak voltage in the alternating current voltage signal includes performing the calculation of: Vpeak=Slew Rate*T/4; where T is the period of the alternating current voltage signal.

16. The method of claim 15, and further comprising:
outputting a signal indicating when the calculated peak voltage is greater than a predetermined threshold.

17. An integrated circuit for monitoring an alternating current voltage signal, comprising: an input terminal coupled to receive the alternating current voltage signal; a clamping circuit coupled to the input terminal and having a clamped output voltage, the clamping circuit configured to limit the output voltage signal between a predetermined positive voltage magnitude and a predetermined negative voltage magnitude; a first comparator coupled to the clamped output voltage and coupled to a positive threshold reference voltage, and configured to output a set signal responsive to a positive magnitude of the output voltage signal exceeding the positive threshold reference voltage; a second comparator coupled to the clamped output voltage and coupled to a negative threshold reference voltage, and configured to output a reset signal responsive to a negative magnitude of the output voltage signal that exceeding the negative threshold reference voltage; a timer circuit coupled to the set signal and coupled to the reset signal and configured to sample the set signal and the reset signal responsive to a clock signal, and to output a time duration signal corresponding to the time between set and reset signals; and a logic circuit coupled to the timer circuit and configured to determine a peak voltage in the alternating current voltage signal responsive to the time duration signal; wherein the logic circuit is configured to perform the calculations of: Slew Rate of the alternating current voltage signal=2*Vth/delta t; where Vth is the positive threshold voltage, and delta t is equal to a ratio of the output of the timer circuit divided by the frequency of the clocked signal, and Vpeak=Slew Rate*T/4; where T is the period of the alternating current voltage signal.

* * * * *